(12) United States Patent
Hong et al.

(10) Patent No.: US 11,785,828 B2
(45) Date of Patent: Oct. 10, 2023

(54) DISPLAY DEVICE

(71) Applicant: Samsung Display Co., LTD., Yongin-si (KR)

(72) Inventors: Jong Beom Hong, Yongin-si (KR); Ree Hyang Kim, Yongin-si (KR); Yong Sub Shim, Yongin-si (KR); Young Jun Yoo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 121 days.

(21) Appl. No.: 17/314,000

(22) Filed: May 6, 2021

(65) Prior Publication Data
US 2021/0376014 A1     Dec. 2, 2021

(30) Foreign Application Priority Data

Jun. 1, 2020 (KR) .......................... 10-2020-0066099

(51) Int. Cl.
| | | |
|---|---|---|
| *H01L 51/52* | (2006.01) | |
| *H10K 59/60* | (2023.01) | |
| *H10K 50/86* | (2023.01) | |
| *H10K 59/65* | (2023.01) | |

(52) U.S. Cl.
CPC ........... *H10K 59/60* (2023.02); *H10K 50/865* (2023.02); *H10K 59/65* (2023.02)

(58) Field of Classification Search
CPC ............. H01L 27/3227; H01L 27/3234; H01L 27/3262; H01L 51/5281; H01L 27/3225; H01L 51/5262; H01L 51/5271; H01L 27/3269
See application file for complete search history.

(56) References Cited

U.S. PATENT DOCUMENTS

| | | | |
|---|---|---|---|
| 8,664,718 B2 | 3/2014 | Cheng et al. | |
| 2004/0256983 A1* | 12/2004 | Hung .................. | H01L 51/5281 313/506 |
| 2017/0068287 A1* | 3/2017 | Jung ....................... | G02B 1/111 |
| 2018/0308903 A1* | 10/2018 | Jeong ..................... | G06F 3/0443 |
| 2019/0073505 A1 | 3/2019 | Kwon et al. | |
| 2020/0019804 A1 | 1/2020 | Kim et al. | |

(Continued)

FOREIGN PATENT DOCUMENTS

| | | | | |
|---|---|---|---|---|
| CN | 113629206 A | * | 11/2021 | ............. H01L 51/52 |
| CN | 114188375 A | * | 3/2022 | ......... H01L 27/3248 |
| KR | 20180092055 | | 8/2018 | |

(Continued)

*Primary Examiner* — Donald L Raleigh
(74) *Attorney, Agent, or Firm* — H.C. Park & Associates, PLC

(57) ABSTRACT

A display device includes: a display panel including a substrate having first and second opposing surfaces and a light emitting element disposed on the first surface of the substrate, the display panel having a transmission area through which light is transmitted from outside the display device; a sensor facing the surface of the substrate and configured to sense light received through the transmission area; and an anti-reflective member disposed between the sensor and the substrate and to transmit light such that reflection of applied light is reduced. The anti-reflective member overlaps the transmission area when viewed in a direction normal to the first and second surfaces of the substrate.

17 Claims, 13 Drawing Sheets

(56) References Cited

U.S. PATENT DOCUMENTS

2020/0045826 A1   2/2020  Wang et al.
2020/0117034 A1*  4/2020  Yin ...................... G02F 1/1339

FOREIGN PATENT DOCUMENTS

| KR | 20190053367 | 5/2019 |
| KR | 20190091711 | 8/2019 |
| KR | 20200002968 | 1/2020 |
| KR | 20200014459 | 2/2020 |

* cited by examiner

DISPLAY DEVICE

CROSS REFERENCE TO RELATED APPLICATION

This application claims priority from and the benefit of Korean Patent Application No. 10-2020-0066099, filed on Jun. 1, 2020, which is hereby incorporated by reference for all purposes as if fully set forth herein.

BACKGROUND

Field

Exemplary implementations of the invention relate generally to a display device, and more particularly, to a display device including a sensor overlapping and/or surrounded by the display area of the device.

Discussion of the Background

A light emitting element exhibits relatively good durability even in a poor environmental condition, and has excellent performance in terms of life and luminance. In order to drive the light emitting element, a display device may include an electrode configuration for transferring power and/or an electrical signal to the light emitting element, and a circuit element capable of applying the power, the electrical signal, and/or information on light emission to the electrode configuration.

Recently, the display device including a sensor configured to obtain optical information has been widely used. The sensor may receive light from the outside in order to obtain the optical information. The sensor may be adjacent to the light emitting element.

The above information disclosed in this Background section is only for understanding of the background of the inventive concepts, and, therefore, it may contain information that does not constitute prior art.

SUMMARY

Applicant realized that when ambient light is incident upon a display device, light may be reflected in the display device, e.g., through a hole for a sensor, and if the reflected light is incident upon a circuit element in the display, deterioration of the circuit element may occur. Accordingly, there is a need for a display device to be able to reduce the reflected light in display devices.

Display devices constructed according to the principles and exemplary implementations of the invention are capable of reducing deterioration of circuit elements due to reflected light. For example, the display device may include one or more anti-reflective members to prevent or at least reduce light from being reflected by layers and/or elements of the display device. Accordingly, the anti-reflective members may attenuate the reflection of light to reduce light transmitted inside of the display device to circuit elements, thereby reducing deterioration of the display device and/or the circuit element caused by the reflected light.

Additional features of the inventive concepts will be set forth in the description which follows, and in part will be apparent from the description, or may be learned by practice of the inventive concepts.

According to one aspect of the invention, a display device includes: a display panel including a substrate having first and second opposing surfaces and a light emitting element disposed on the first surface of the substrate, the display panel having a transmission area through which light is transmitted from outside the display device; a sensor facing the surface of the substrate and configured to sense light received through the transmission area; and an anti-reflective member disposed between the sensor and the substrate and to transmit light such that reflection of applied light is reduced. The anti-reflective member overlaps the transmission area when viewed in a direction normal to the first and second surfaces of the substrate.

The sensor overlaps the anti-reflective member.

The display device may further include: a base facing the substrate. The sensor may be disposed on the base.

The display device may further include: a cover panel disposed on the second surface of the substrate without overlapping the transmission area and without overlapping the sensor.

The anti-reflective member may have a refractive index different from a refractive index of the substrate.

The refractive index of the anti-reflective member may be substantially equal to or greater than about 1.3 and is equal to or less than about 1.7.

The anti-reflective member may include a reflection reduction member including a filler having a transmittance of a predetermined value or more.

The reflection reduction member may be physically spaced apart from the sensor so that an air gap is formed between the reflection reduction member and the sensor.

The reflection reduction member may be in physical contact with the sensor so that no air gap is formed between the reflection reduction member and the sensor.

The sensor may overlap the reflection reduction member.

The anti-reflective member may include a reflection reduction member including a first anti-reflection film coated on a surface of the sensor facing the substrate, and the first anti-reflection film may be an anti-reflective coating.

The reflection reduction member may further include a second anti-reflection film coated on the second surface of the substrate facing the sensor, and the second anti-reflection film may include another anti-reflective coating.

The first anti-reflection film may overlap the second anti-reflection film.

The first anti-reflection film may include a third surface and a fourth surface opposing the third surface, the third surface may be in contact with the substrate, and the fourth surface may be in contact with the sensor.

The second anti-reflection film may be disposed in a region where the first anti-reflection film is positioned.

The display device may further include: an air gap formed between the first anti-reflection film and the second anti-reflection film.

The sensor may include at least one of an optical fingerprint sensor, an illumination sensor, a proximity sensor, a camera module, and a light sensor.

The anti-reflective member may include a first reflection reduction member and a second reflection reduction member, the first reflection reduction member may include a filler having a transmittance of a predetermined value or more, and the second reflection reduction member may include an anti-reflective coating.

The display device may further include: an air gap formed between the first reflection reduction member and the second reflection reduction member.

The second reflection reduction member may be coated on the sensor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
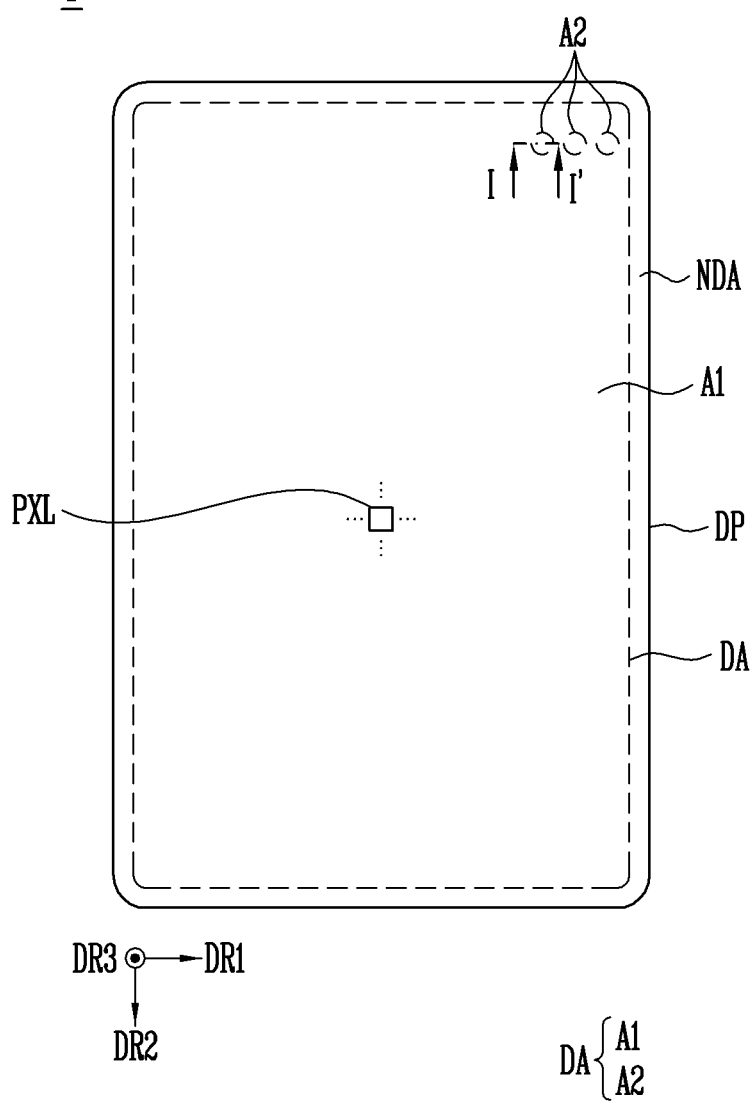
FIGS. 1 to 3 are plan views of exemplary embodiments of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z-axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
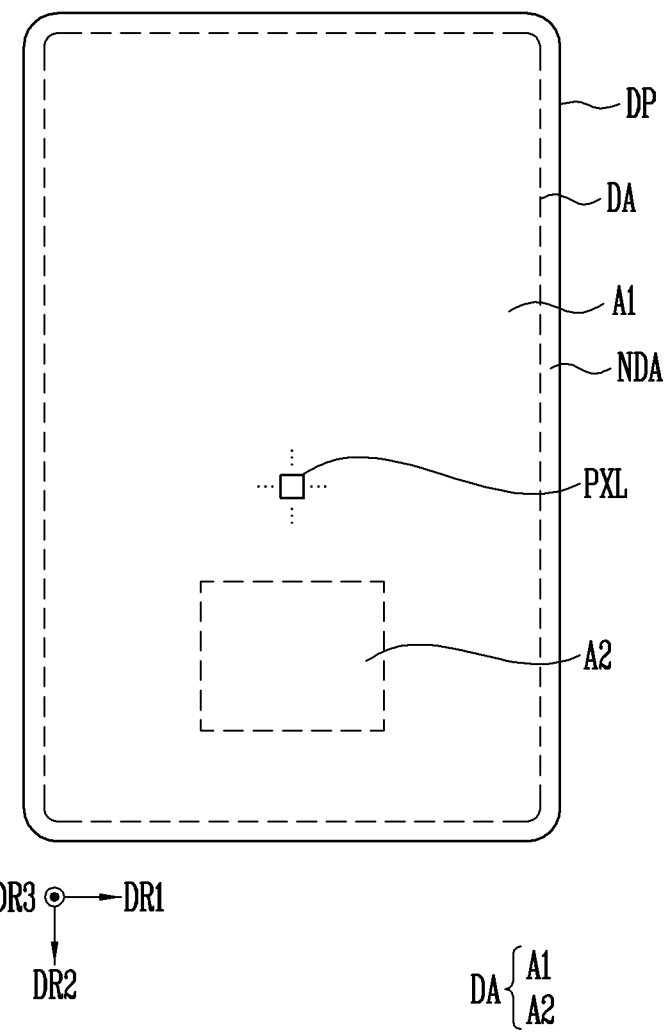
Figure 3:
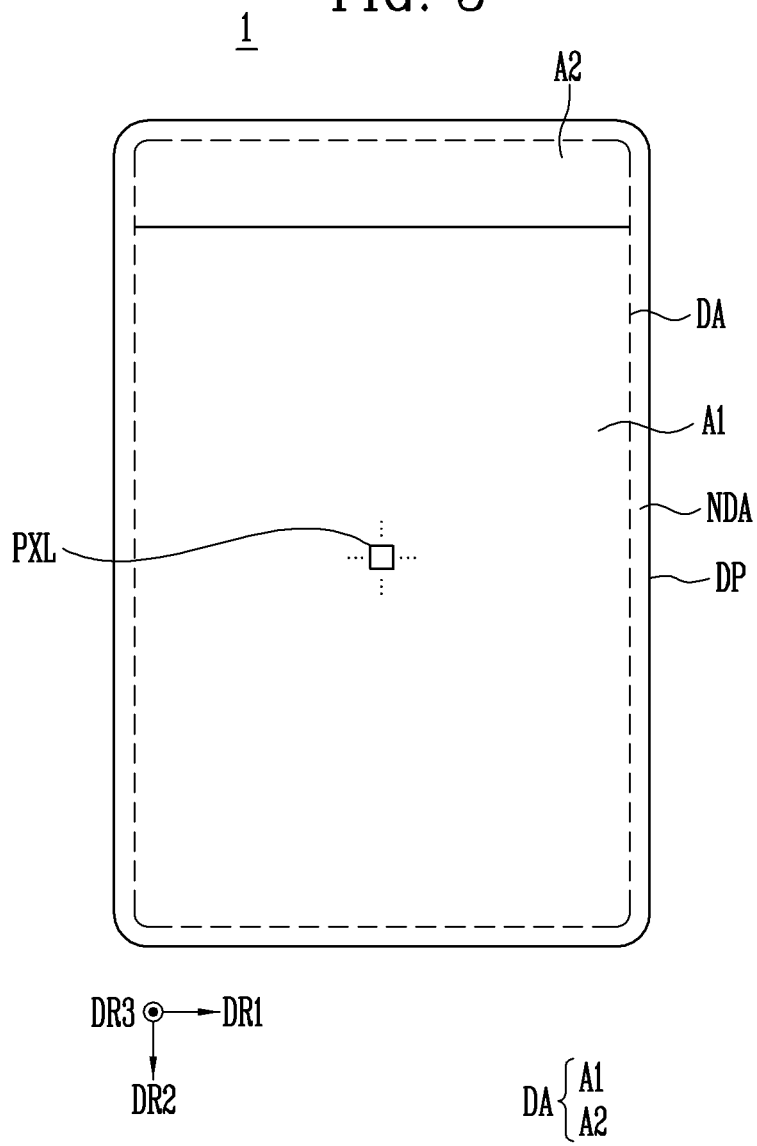

FIGS. 1 to 3 are plan views of exemplary embodiments of a display device constructed according to the principles of the invention.

A display device refers to a device configured to provide visual data to a user. The display devices described herein refer to a device including a light emitting element configured to emit light when an electrical signal is applied. That is, the display device 1 according to the exemplary embodiment of the invention is not limited to a specific application such as a tablet PC, a television, a smart phone, and a laptop.

A display device 1 may include a display panel DP having a pixel PXL, and a sensor (refer to 'SR' of FIG. 5), which may be any device that senses light and produces an electronic signal, such as those described in more detail herein.

The display panel DP may include the display area DA and the non-display area NDA.

According to an exemplary embodiment, the display panel DP may include a sensing area and a non-sensing area. The display panel DP may not only display an image but also sense a touch input performed on a display surface and sense light incident from the front in the sensing area. The non-sensing area may surround the sensing area, but the exemplary embodiments are not limited thereto. According to an exemplary embodiment, some areas of the display area DA may correspond to the sensing area.

The display area DA and the non-display area NDA may be physically divided.

The pixel PXL may be positioned in the display area DA.
The sensor SR may be positioned in the display area DA.
A plurality of pixels PXL may be disposed on the display panel DP. That is, although only a single representative pixel PXL is shown in FIGS. 1 to 3 for convenience, the display device 1 includes the plurality of pixels PXL.

The display panel DP may output visual information on a front surface of the display device 1.

The pixel PXL may include at least a light emitting element. The light emitting element may include a material that functions as a light source that emits light when an electrical signal is applied.

When an electric signal corresponding to image data to be output is applied, the pixel PXL may emit light that may be output to the display area DA.

The light emitting element may be an inorganic light emitting element including an inorganic light emitting material or a light emitting element (quantum dot display element) that emits light by changing a wavelength of light emitted using a quantum dot.

For the structure of the display panel DP, a self-luminous display panel such as an organic light emitting diode (OLED) panel using an OLED as a light emitting element, an ultra-small light emitting diode display panel (nano-scale LED display panel) using an ultra-small light emitting diode as a light emitting element, and a quantum dot organic light emitting display panel (QD OLED panel) using a quantum dot and an OLED may be used. However, the display panel DP is not limited to the above-described examples, and the display panel DP may be at least any one of a liquid crystal display panel (LCD panel), an electrophoretic display panel (EPD panel), an electro-wetting display panel (EWD panel) and any other known display panels.

Hereinafter, for convenience, the light emitting element included in the display device 1 is described based on an OLED.

The sensor SR may be positioned in the display area DA when viewed from above of the display device 1. The sensor SR may be positioned under the pixels PXL of the display device 1 and/or lines connected to the pixels PXL, and thus the sensor SR may be concealed with respect to the front surface of the display device 1. "When viewed from above" defined herein may refer to a third direction DR3 which is a direction perpendicular to the front surface of the display panel DP.

Since the structure of the sensor SR will be described later with reference to FIGS. 5 to 8, a detailed description thereof is omitted to avoid redundancy.

The display area DA is an area where visual data is displayed to the outside. The display area DA refers to an area where the pixel PXL is positioned.

The non-display area NDA refers to an area where there are no pixels PXL.

The non-display area NDA and the display area DA may not overlap each other when viewed from above. For example, the non-display area NDA may be positioned in an area at least partially surrounding an outer edge of the display area DA.

According to an exemplary embodiment, the non-display area NDA may include a line area, a pad area, and/or a dummy area.

The display area DA may include a first display area A1 and a second display area A2.

Figure 5:
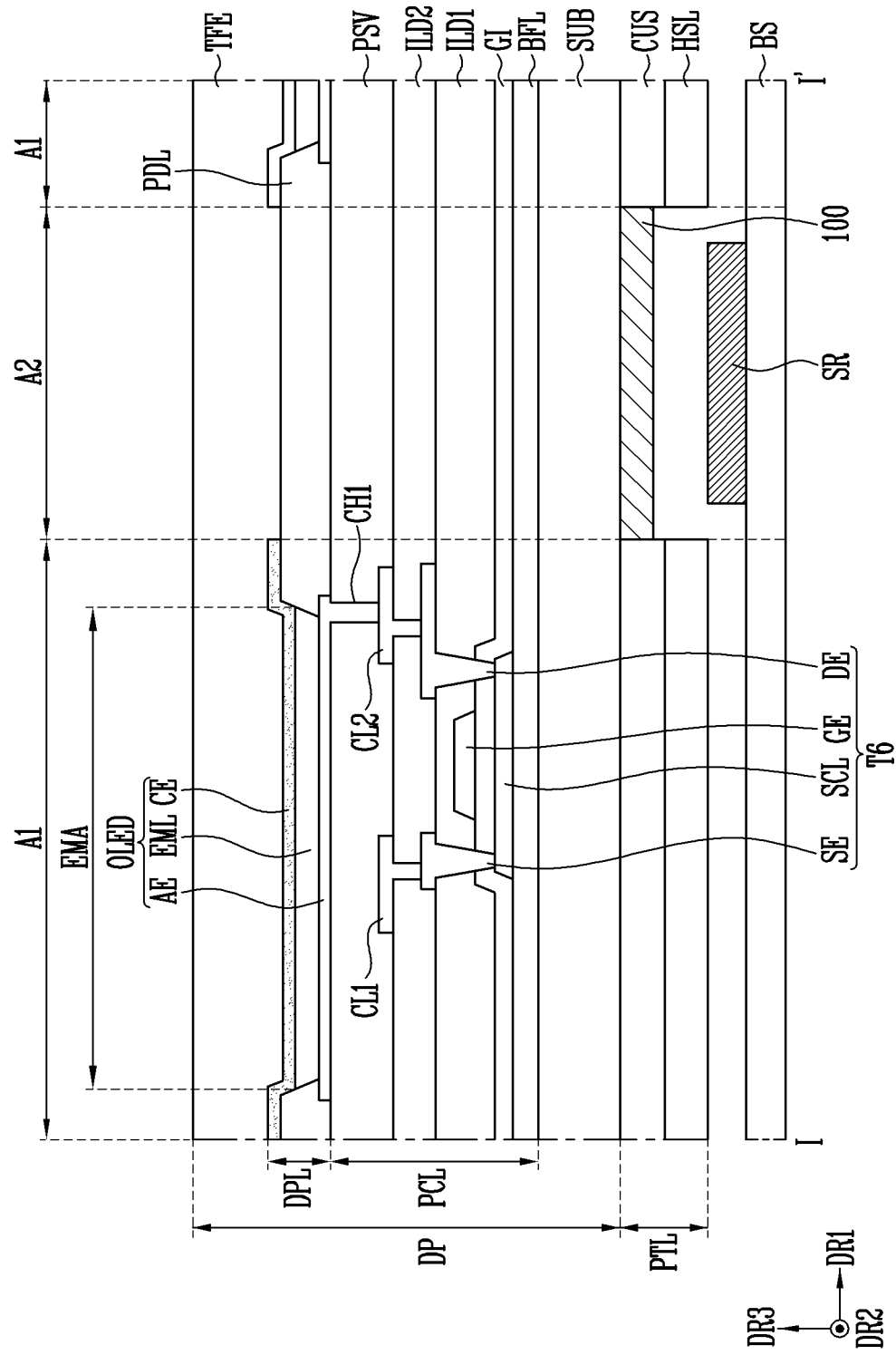
FIGS. 5 to 8 are cross-sectional views taken along a line I-I' of FIG. 1 to illustrate exemplary embodiments of the display device.

When viewed from above of the display device 1, the first display area A1 may refer to an area overlapping an emission area EMA (refer to FIG. 5). When viewed from above the display device 1, the second display area A2 may refer to an area that does not overlap the emission area EMA (refer to FIG. 5).

As shown in FIGS. 1 and 2, the second display area A2 may be surrounded by the first display area A1. Alternatively, as shown in FIG. 3, the second display area A2 may be partitioned from the first display area A1 along the second direction DR2. The second display area A2 is not limited to the above-described example, but may be disposed adjacent to or distributed anywhere in the display area DA, and may be provided in singular or plural.

The light transmittance of the second display area A2 may be higher than a light transmittance of the first display area A1. The light transmittance may be defined as the ratio of an intensity of transmitted light to an intensity of applied light per unit area. The number of pixels PXL per unit area in the second display area A2 may be less than the number of pixels PXL per unit area in the first display area A1. Alternatively, the pixel PXL may not be disposed in the second display area A2.

The display device 1 may further include a window positioned at the uppermost end of the display device 1. The window may be a transparent transmitting substrate. The window may mitigate an external impact to the display device 1 while transmitting visual information.

A touch sensor may be disposed between the display panel DP and the window. The touch sensor may be disposed on a surface on which the image is emitted from the display panel DP to receive a touch input of a user.

Figure 4:
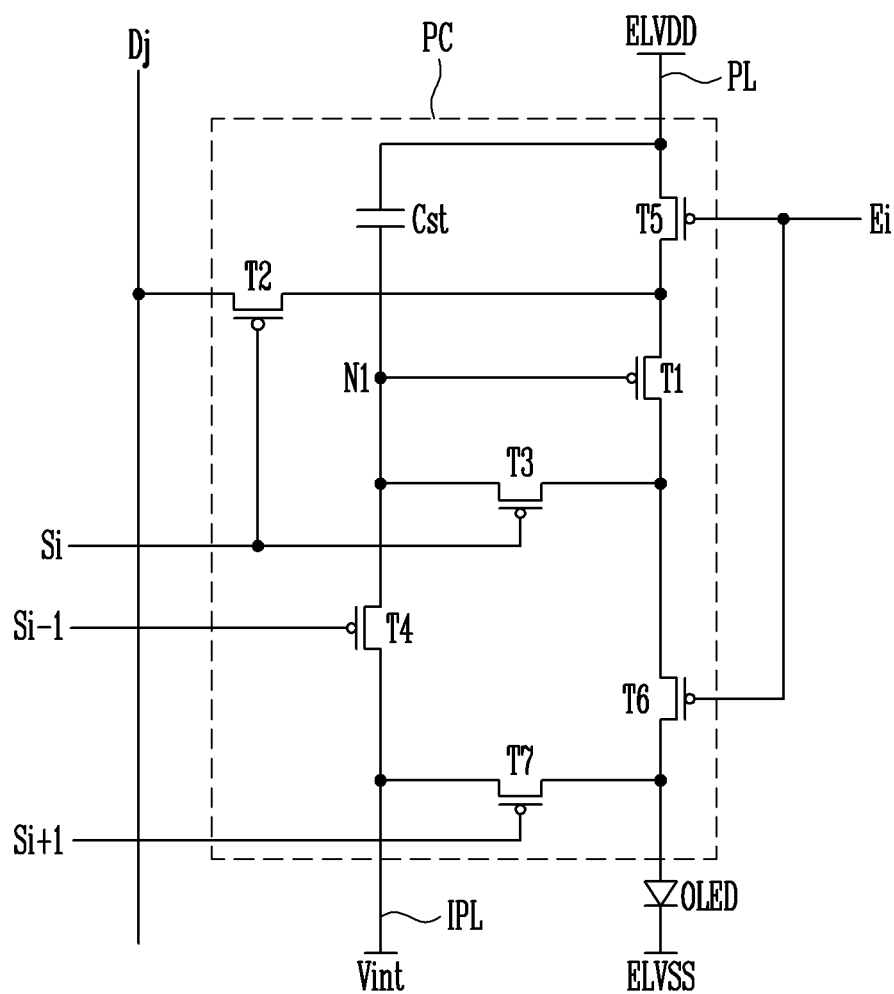
FIG. 4 is a circuit diagram of an exemplary embodiment of a pixel driving circuit of a representative one of the pixels of FIGS. 1 to 3.

FIG. 4 is a circuit diagram of an exemplary embodiment of a pixel driving circuit of a representative one of the pixels of FIGS. 1 to 3.

The display device 1 may include a pixel driving circuit PC, which may be implemented by a pixel circuit portion PCL of FIG. 5.

The pixel driving circuit PC may include first to seventh transistors T1 to T7 and a storage capacitor Cst. The pixel driving circuit PC may be electrically connected to a light emitting element EL, which may be implemented by a display element portion DPL of FIG. 5.

A first electrode of the first transistor T1 may be connected to first power ELVDD through the fifth transistor T5, and a second electrode of the first transistor T1 may be connected to an anode electrode of the light emitting element EL through the sixth transistor T6. The first transistor T1 may control current data flowing from the first power ELVDD to second power ELVSS through the light emitting element EL based on information on a voltage of a first node N1. The first transistor T1 may be a driving transistor.

The second transistor T2 may be connected between the first electrode of the first transistor T1 and a j-th data line Dj. A gate electrode of the second transistor T2 may be connected to an i-th scan line Si. The second transistor T2 may be turned on when a scan signal is applied from the i-th scan line Si, and may electrically connect the j-th data line Dj and the first electrode of the first transistor T1. The second transistor T2 may be a switching transistor.

The third transistor T3 may be connected between the second electrode of the first transistor T1 and the first node N1. The third transistor T3 may be turned on when a scan signal of a gate-on voltage is applied from the i-th scan line Si, and may electrically connect the second electrode of the first transistor T1 and the first node N1. As a result, when the third transistor T3 is turned on, the first transistor T1 may be connected in a diode form.

The fourth transistor T4 may be connected between the first node N1 and an initialization power line IPL to which initialization power Vint is applied. A gate electrode of the fourth transistor T4 may be connected to an (i−1)-th scan line Si−1. The fourth transistor T4 may be turned on when a scan signal is applied to the (i−1)-th scan line Si−1 to supply a voltage of the initialization power Vint to the first node N1. The fourth transistor T4 may be an initialization transistor.

The fifth transistor T5 may be connected between a power line PL to which the first power ELVDD is applied and the first transistor T1. A gate electrode of the fifth transistor T5 may be connected to an i-th emission control line Ei. The fifth transistor T5 may be turned off when an emission control signal of a gate-off voltage is applied from the i-th emission control line Ei, and may be turned on in other cases.

The sixth transistor T6 may be connected between the first transistor T1 and the light emitting element EL. A gate electrode of the sixth transistor T6 may be connected to the i-th emission control line Ei. The sixth transistor T6 may be turned off when an emission control signal of a gate-off voltage (for example, a high level voltage) is applied from the i-th emission control line Ei, and may be turned on in other cases.

The seventh transistor T7 may be connected between the initialization power line IPL and a first electrode (according to an example, the first electrode may be the anode electrode) of the light emitting element EL. A gate electrode of the seventh transistor T7 may be connected to an (i+1)-th scan line Si+1. The seventh transistor T7 may be turned on when a scan signal of a gate-on voltage (for example, a low level voltage) is applied from the (i+1)-th scan line Si+1 to supply a voltage of the initialization power Vint to the anode electrode of the light emitting element EL. A signal applied to the gate electrode of the seventh transistor T7 may be a signal of the same timing as the scan signal of the gate-on voltage applied from the i-th scan line Si.

The voltage of the initialization power Vint may be set to a voltage lower than a data signal. For example, the voltage of the initialization power Vint may be set to be equal to or lower than a minimum voltage of the data signal.

The storage capacitor Cst may be connected between the power line PL to which the first power ELVDD is applied and the first node N1. The storage capacitor Cst may store information on a data signal and a voltage corresponding to a threshold voltage of the first transistor T1.

The anode electrode of the light emitting element EL may be connected to the first transistor T1 through the sixth transistor T6. A cathode electrode of the light emitting element EL may be connected to the second power ELVSS.

The light emitting element EL may emit light of a predetermined luminance corresponding to a current amount supplied from the first transistor T1. A voltage value of the first power ELVDD may be set to be higher than a voltage value of the second power ELVSS so that a current flows to the light emitting element EL.

The light emitting element EL may be an "OLED" as described above. The light emitting element OLED may emit light of at least one color of red, green, blue, and white colors.

Hereinafter, a detailed, exemplary individual structure of the display device 1 including the sensor SR and the display panel DP will be described below with reference to FIGS. 5 to 8.

FIGS. 5 to 8 are cross-sectional views taken along a line I-I' of FIG. 1 to illustrate exemplary embodiments of the display device. FIGS. 5 to 8 show only the sixth transistor T6 among the first to seventh transistors T1 to T7 of FIG. 4 for convenience of description.

The display device 1 may further include a base portion BS, a display panel DP, and a cover panel PTL.

The sensor SR may be positioned on the base portion BS. The base portion BS may be provided in a substrate form. According to an example, the base portion BS may include a plastic or metal material, such as a bracket and a case.

The display panel DP may include the substrate SUB, a pixel circuit portion PCL, a display element portion DPL, and a thin film encapsulation film TFE.

The substrate SUB may include a rigid material or a flexible material according to a purpose of the display device 1. For example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. However, the material of the substrate SUB is not limited thereto.

The substrate SUB may face the base portion BS. The substrate SUB may be at least spaced apart from the base portion BS. However, according to an exemplary embodiment, the substrate SUB may be in contact with the base portion BS, and is not limited to the above-described embodiment.

The pixel circuit portion PCL may be positioned on the substrate SUB. The pixel circuit portion PCL may include a buffer layer BFL, a gate insulating film GI, the sixth transistor T6, a first interlayer insulating film ILD1, a second interlayer insulating film ILD2, a first conductive line CL1, a second conductive line CL2, a first contact hole CH1, and a protective film PSV.

The buffer film BFL may be positioned on the substrate SUB. The buffer film BFL may prevent diffusion of an impurity to the sixth transistor T6. The buffer film BFL may include at least one of silicon nitride (SiNx), silicon oxide (SiOx), silicon oxynitride (SiOxNy), and aluminum oxide (AlOx). However, the buffer film BFL may be omitted.

The sixth transistor T6 may be positioned in the first display area A1. The sixth transistor T6 may include a semiconductor pattern SCL, a source electrode SE, a drain electrode DE, and a gate electrode GE.

The semiconductor pattern SCL may be positioned on the buffer film BFL.

The semiconductor pattern SCL may be a semiconductor layer. According to an example, the semiconductor pattern SCL may include at least one of polysilicon, amorphous silicon, and an oxide semiconductor.

The semiconductor pattern SCL may include a first contact region contacting the source electrode SE and a second contact region contacting the drain electrode DE.

The first contact region and the second contact region may be semiconductor patterns doped with an impurity. A region between the first contact region and the second contact region may be a channel region. The channel region may be an intrinsic semiconductor pattern in which an impurity is not doped.

The gate insulating film GI may be provided on the semiconductor pattern SCL. The gate insulating film GI may include an inorganic material. According to an example, the gate insulating film GI may include at least one of silicon nitride (SiNx), silicon oxide (SiOx), silicon oxynitride (SiOxNy), and aluminum oxide (AlOx). According to an exemplary embodiment, the gate insulating film GI may include an organic material.

The gate electrode GE may be positioned on the gate insulating film GI.

The position of the gate electrode GE may correspond to and/or overlap a position of the channel region of the semiconductor pattern SCL. For example, the gate electrode GE may be disposed on the channel region of the semiconductor pattern SCL with the gate insulating film GI interposed therebetween.

The first interlayer insulating film ILD1 may be positioned on the gate electrode GE. Similar to the gate insulating film GI, the first interlayer insulating film ILD1 may include at least one of silicon nitride (SiNx), silicon oxide (SiOx), silicon oxynitride (SiOxNy), and aluminum oxide (AlOx).

The source electrode SE and the drain electrode DE may be positioned on the first interlayer insulating film ILD1. The source electrode SE may pass through the gate insulating film GI and the first interlayer insulating film ILD1 and contact the first contact region of the semiconductor pattern SCL. The drain electrode DE may pass through the gate insulating film GI and the first interlayer insulating film ILD1 and contact the second contact region of the semiconductor pattern SCL.

In the above-described embodiment, the source electrode SE and the drain electrode DE of the sixth transistor T6 are separate electrodes passing through the gate insulating film GI and the first interlayer insulating film ILD1 and electrically connected to the semiconductor pattern SCL, but the disclosure is not limited thereto. The source electrode SE of the sixth transistor T6 may be one of the first and second contact regions adjacent to the channel region of the semiconductor pattern SCL, and the drain electrode DE of the sixth transistor T6 may be the other contact region of the first and second contact regions adjacent to the channel region of the semiconductor panel SCL. In this case, the drain electrode DE of the sixth transistor T6 may be electrically connected to some configurations of the display element portion DPL through separate connection means including a contact electrode or the like.

The second interlayer insulating film ILD2 may be positioned on the source electrode SE and the drain electrode DE. The second interlayer insulating film ILD2 may include an inorganic material similarly to the first interlayer insulating film ILD1 and the gate insulating film GI. The inorganic material may include at least one of the materials exemplified as a configuration material of the first interlayer insulating film ILD1 and the gate insulating film GI, for example, silicon nitride (SiNx), silicon oxide (SiOx), silicon oxynitride (SiOxNy), and aluminum oxide (AlOx). According to an exemplary embodiment, the second interlayer insulating film ILD2 may include an organic material.

The first conductive line CL1 may be positioned on the second interlayer insulating film ILD2 and may be electrically connected to the source electrode SE through a contact hole passing through the second interlayer insulating film ILD2.

The second conductive line CL2 may be positioned on the second interlayer insulating film ILD2 and may be electrically connected to the drain electrode DE through a contact hole passing through the second interlayer insulating film ILD2.

The first conductive line CL1 and the second conductive line CL2 may be paths through which an electrical signal may flow. In particular, the second conductive line CL2 may be a bridge electrode that electrically connects the drain electrode DE of the transistor T and some configurations of the display element portion DPL. According to an example, the first conductive line CL1 and the second conductive line CL2 may include at least one of molybdenum (Mo), tungsten (W), aluminum-neodymium (AlNd), titanium (T1), aluminum (Al), and silver (Ag).

The protective film PSV may be provided on the first conductive line CL1 and the second conductive line CL2. The protective film PSV may be provided in a form including an organic insulating film, an inorganic insulating film, or the organic insulating film disposed on the inorganic insulating film.

The protective film PSV may include a first contact hole CH1 exposing a region of the second conductive line CL2.

The first contact hole CH1 may be a path through which an electrical signal provided from the sixth transistor T6 is transferred.

The display element portion DPL may include a pixel definition film PDL and the light emitting element OLED.

The pixel definition film PDL may define a position where the light emitting element OLED is arranged.

The pixel definition film PDL may include an organic material. According to an example, the pixel definition film PDL may include at least one of an acryl resin, epoxy resin, phenol resin, polyamide resin, and polyimide resin.

The light emitting element OLED may include a first electrode AE, the emission layer EML, and a second electrode CE. The light emitting element OLED may be positioned on the protective film PSV in the first display area A1.

One of the first and second electrodes AE and CE may be the anode electrode, and the other of the first and second electrodes AE and CE may be the cathode electrode. When the light emitting element OLED is a front emission type organic light emitting diode, the first electrode AE may be a reflective electrode and the second electrode CE may be a transmissive electrode. Hereinafter, a case where the light emitting element OLED is the front emission type organic light emitting diode and the first electrode AE is the anode electrode will be described as an example.

The first electrode AE may be positioned on the protective film PSV in the first display area A1. The first electrode AE may be electrically connected to the second conductive line CL2 through the first contact hole CH1. The first electrode AE may include a reflective film that may reflect light, or a transparent conductive film disposed on or under the reflective film. For example, the first electrode AE may be configured of multiple films including a lower transparent conductive film formed of indium tin oxide (ITO), the reflective film provided on the lower transparent conductive film and formed of silver (Ag), and an upper transparent conductive film provided on the reflective film and formed of indium tin oxide (ITO). At least one of the transparent conductive film and the reflective film may be electrically connected to the drain electrode DE of the sixth transistor T6.

The emission layer EML may be disposed in an area defined by the pixel definition film PDL. The emission layer EML may define an emission area EMA in which light is emitted. The emission layer EML may include an organic material and/or an inorganic material.

Specifically, the emission EML may have a multi-layer thin film structure including at least a light generation layer. The emission layer EML may include a hole injection layer that injects a hole, a hole transport layer having excellent hole transport properties and for increasing a chance of recombination of a hole and an electron by suppressing a movement of an electron that is not combined in the light generation layer, the light generation layer that emits light by the recombination of the injected electron and hole, a hole blocking layer for suppressing a movement of a hole that is not combined in the light generation layer, an electron transport layer for smoothly transporting the electron to the light generation layer, and an electron injection layer for injecting the electron. When an electrical signal is applied to the emission layer EML as described above, light may be emitted. The color of the light generated in the emission layer EML may be one of red, green, blue, and white, but the exemplary embodiments are not limited thereto. For example, the color of the light generated in the emission layer EML may be one of magenta, cyan, and yellow.

The second electrode CE may be provided on the emission layer EML. The second electrode CE may be provided in a plate shape on the first display area A1, but is not limited thereto. The second electrode CE may include a transparent conductive material such as transparent conductive oxide of one of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO). When the light emitting element OLED is a back emission type organic light emitting diode, the second electrode CE may include translucent conductive material such as magnesium (Mg), silver (Ag), or an alloy of magnesium (Mg) and silver (Ag).

The thin film encapsulation film TFE may be positioned on the second electrode CE. The thin film encapsulation film TFE may include a plurality of insulating films covering the light emitting element OLED. Specifically, the thin film encapsulation film TFE may include at least one inorganic film and/or at least one organic film. For example, the thin film encapsulation film TFE may have a structure in which an inorganic film and an organic film are alternately stacked.

The cover panel PTL may be positioned on a rear surface of the substrate SUB. The cover panel PTL may include a heat dissipation layer HSL and a cushion layer CUS.

Referring to FIG. 5, the heat dissipation layer HSL is positioned on a lower surface of the cushion layer CUS, but is not limited thereto. According to an exemplary embodiment, the cushion layer CUS may be positioned on a lower surface of the heat dissipation layer HSL.

The cushion layer CUS includes an elastically deformable material to mitigate external impact applied to the display device 1. For example, the cushion layer CUS may include a thermoplastic elastomer, polystyrene, polyolefin, polyurethane thermoplastic elastomers, polyamides, synthetic rubbers, polydimethylsiloxane, polybutadiene, polyisobutylene, poly(styrene-butadiene styrene), polyurethane, polychloroprene, polyethylene, silicone, and the like, and combinations thereof, but the exemplary embodiments are not limited to the above-described examples. A suitable material for the cushion layer CUS may be selected among any materials having elasticity as long as it does not affect image displayed by the display panel DP.

The heat dissipation layer HSL may perform heat dissipation for individual configurations of the display device 1. The heat dissipation layer HSL may include a material having high thermal conductivity. According to an example, the heat dissipation layer HSL may include graphite.

The heat dissipation layer HSL may have high light absorption when light is applied as well as heat. As described above, the heat dissipation layer HSL may include graphite. Therefore, the heat dissipation layer HSL generally has a dark color, and as a result, the heat dissipation layer HSL has a high light absorption.

The sensor SR may be positioned on the base portion BS, and may correspond to and/or overlap the second display area A2 of the display panel DP. As described above, the elements of the display device 1, such as the layers and films of the display panel DP, may have a light transmittance in the second display area A2 higher than the light transmittance in the first display area A1. Therefore, loss of light applied to the second display area A2 may be minimized and the light may be provided to the sensor SR.

However, according to an exemplary embodiment, the sensor SR may be positioned in the first display area A1, but the position of the sensor SR is not limited to the specific area described above. Hereinafter, description will be given based on the example of sensor SR being positioned in the second display area A2.

The second display area A2 may be referred to as a transmission area because it has a higher light transmittance than other areas such as the first display area A1.

A plurality of insulating films (for example, the first interlayer insulating film ILD1, the second interlayer insulating film ILD2, and the like) corresponding to the second display area A2 may transmit the applied light. Refractive indices of individual layers corresponding to the second display area A2 may be different from those of adjacent layers, respectively.

Figure 6:
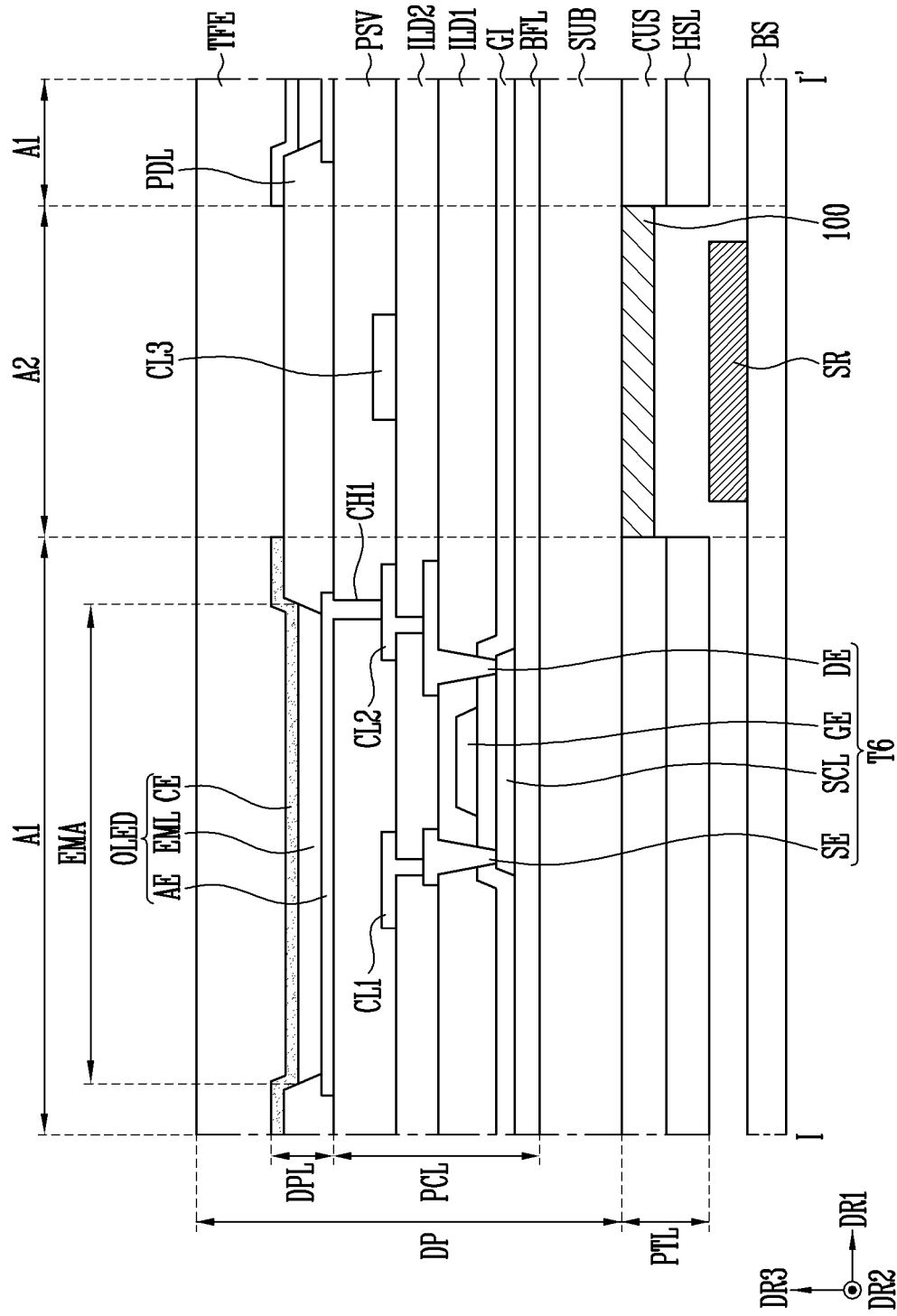

Referring to FIG. 6, according to an exemplary embodiment, the display device 1 may further include a third conductive line CL3 positioned in the second display area A2. The third conductive line CL3 may be arranged on the second interlayer insulating film ILD2 in the second display area A2.

In case where the sensor SR is configured to perform a sensing function (for example, a proximity sensor) other than an illuminance sensor, the third conductive line CL3 may be provided in the second display area A2.

The third conductive line CL3 may be an upper electrode of the storage capacitor Cst or the initial power line IPL described above with reference to FIG. 4. Alternatively, the third conductive line CL3 may be a line for electrically connecting any one of individual configurations included in the pixel PXL.

However, according to an exemplary embodiment, the third conductive line CL3 may not be positioned in the second display area A2, but the exemplary embodiments are not limited to configuration shown in the drawings or the above-described embodiment.

Figure 7:
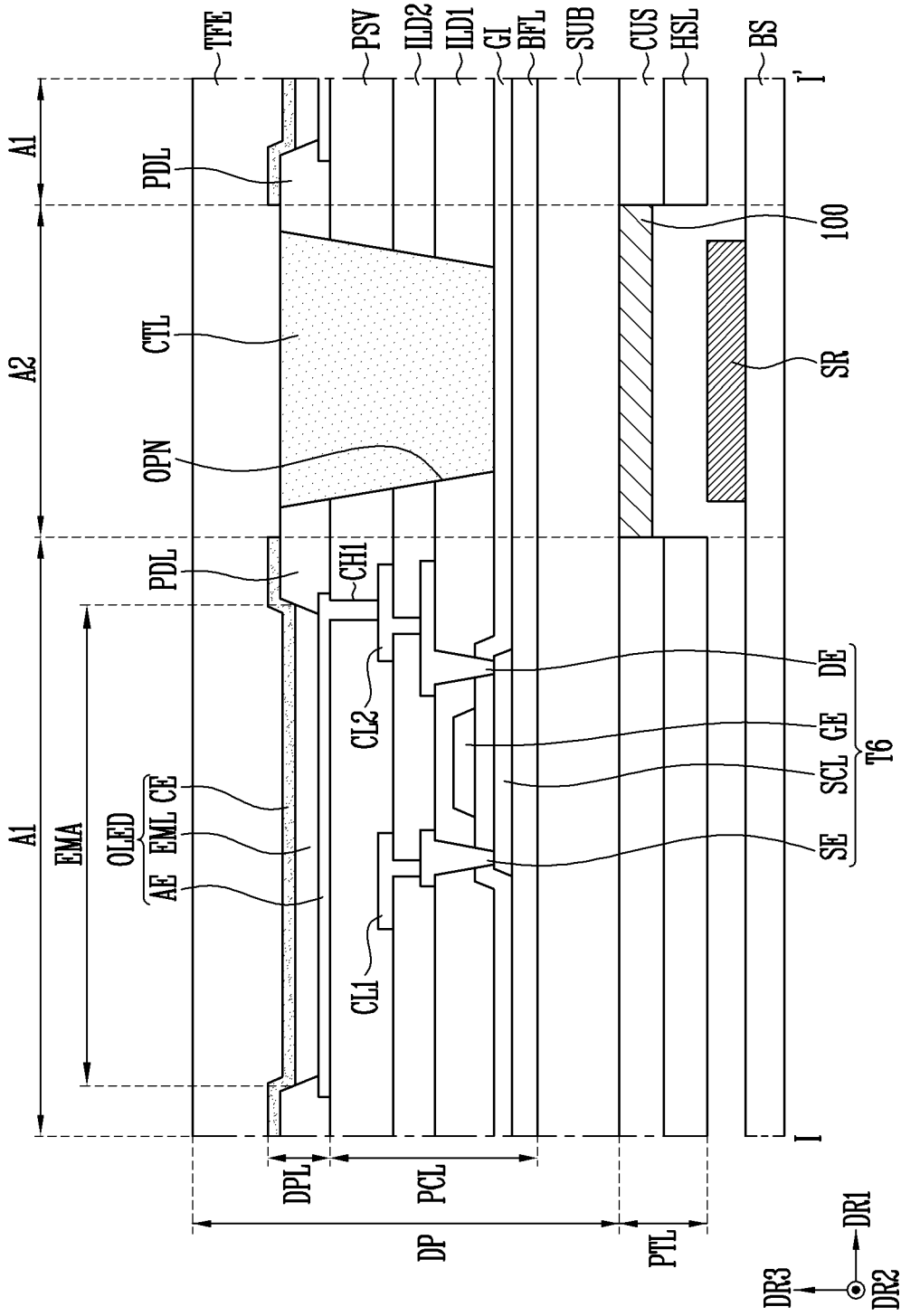

Referring to FIG. 7, the display device 1 may include an opening OPN to minimize loss of light transmitted in the second display area A2. The opening OPN may be formed by removing a portion of an insulating film corresponding to the second display area A2. According to an example, the opening OPN may be formed by removing a portion of the first interlayer insulating film ILD1, the second interlayer insulating film ILD2, and the protective film PSV.

In addition, when the opening OPN is formed in the second display area A2, an intermediate layer CTL may be provided in a form filling the opening OPN. According to an example, the intermediate layer CTL may be an air layer or an optically clear adhesive layer to minimize the loss of transmitted light. However, the intermediate layer CTL is not limited to the above-described example.

Figure 8:
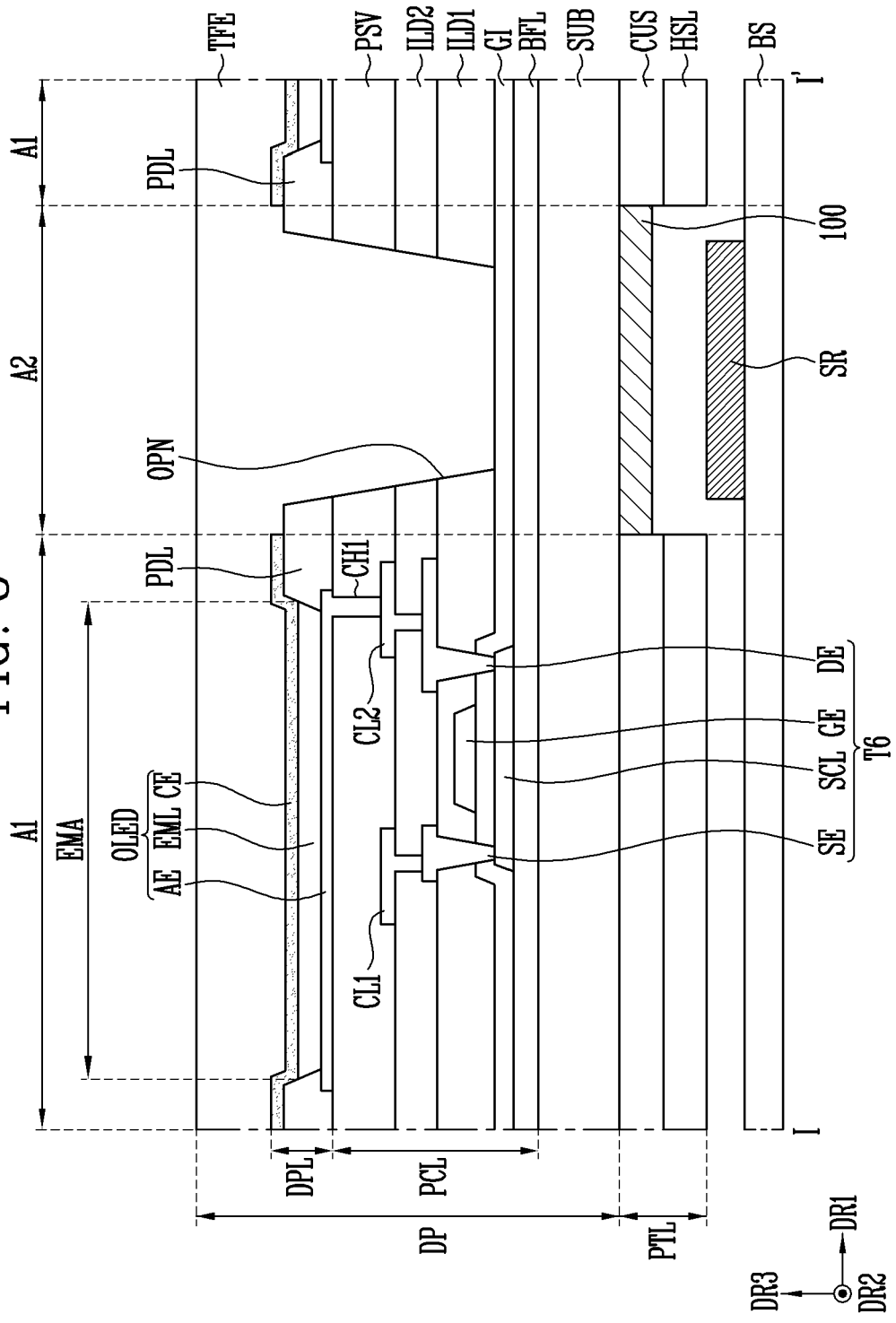

Referring to FIG. 8, the display device 1 may include an opening OPN to minimize loss of light transmitted in the second display area A2, and the thin film encapsulation film TFE may be provided in a form of filling the inside of the opening OPN. In this case, the thin film encapsulation film TFE may include a material having high light transmittance to minimize loss of light passing through the opening OPN.

The sensor SR may be an optical module configured to sense light to obtain information about the incident light. According to an example, the sensor SR may be at least one of an optical fingerprint sensor, an illumination sensor, a camera module, an image capture device, a strobe, an optical sensor, a proximity sensor, an indicator, or a solar panel.

The sensor SR may be positioned in an area corresponding to an area where the heat dissipation layer HSL is not positioned, so the sensor SR does not overlap the heat dissipation layer HSL. As described above, the heat dissipation layer HSL may have a high light absorption. Therefore, most of light provided from an area (for example, the first display area A1) corresponding to the heat dissipation layer HSL may be absorbed by the heat dissipation layer HSL. The sensor SR may be a device for recognizing light information, and the heat dissipation layer HSL may not be positioned in an area (for example, the second display area A2) corresponding to an area where the sensor SR is positioned.

A anti-reflective member, which is in the form of a reflection reduction member 100, may be positioned on the rear surface of the substrate SUB, and may overlap the second display area A2 and the sensor SR. The reflection reduction member 100 may reduce the amount of reflected light provided through an upper surface of the second display area A2.

The area of the reflection reduction member 100 may be substantially equal to or wider than that of the sensor SR when viewed from above.

The reflection reduction member 100 may reduce reflection of external light.

The external light refers to ambient light applied from the outside of the display device 1. The external light may be provided to an inner area of the display device 1 through the second display area A2.

An internal light refers to light generated inside the display device 1. The internal light may refer to light output from the light emitting element OLED included in the display element portion DPL.

The reflection reduction member 100 may reduce reflection of the external light that may be directed to the display panel DP.

The external light applied through the second display area A2 may be provided to the sensor SR along the third direction DR3. If the reflection reduction member 100 is not provided, the reflection light for the external light may be output on one surface of the substrate SUB facing the sensor SR. In this case, the output reflection light may be provided to the pixel circuit portion PCL, and this may cause deterioration of individual configurations including the transistor of the pixel circuit portion PCL.

The reflection reduction member 100 disposed between the sensor SR and the display panel DP may prevent or at least reduce the light from being reflected, and allow and/or help the light to pass through the reflection reduction member 100. Accordingly, the reflection reduction member 100 may reduce deterioration of individual configurations of the display device 1 such as the pixel circuit portion PCL and the display element portion DPL due to influence of the reflection of the external light as well as the internal light.

Hereinafter, a detailed exemplary structure of the reflection reduction member 100 and an effect thereof will be described with reference to a simplified drawing.

FIGS. 9 to 12 are schematic cross-sectional views taken along a line I-I' of FIG. 1 for illustrating exemplary embodiments of the reflection reduction member of FIG. 5.

FIGS. 9 to 18 briefly show exemplary, internal individual configurations of the display device 1 described above with reference to FIG. 5 for convenience of description.

Referring to FIGS. 9 to 12, the reflection reduction member 100 of FIG. 5 may include an anti-reflective coating.

The AR coating may mean applying a composition having an anti-reflection function to one surface of a layer. Here, the applied composition may have a low reflectance and a high transmittance. The AR coating may be implemented as a single layer or a composite layer. According to an example, the composition used for the AR coating may include at least one of SiO2, ZiO2, Al2O3, and TiO2. However, the AR coating are not limited to the above-described example, and various known AR coating compositions or embodiments may be applied to the disclosure.

The AR coating may form an anti-reflection film.

Figure 9:
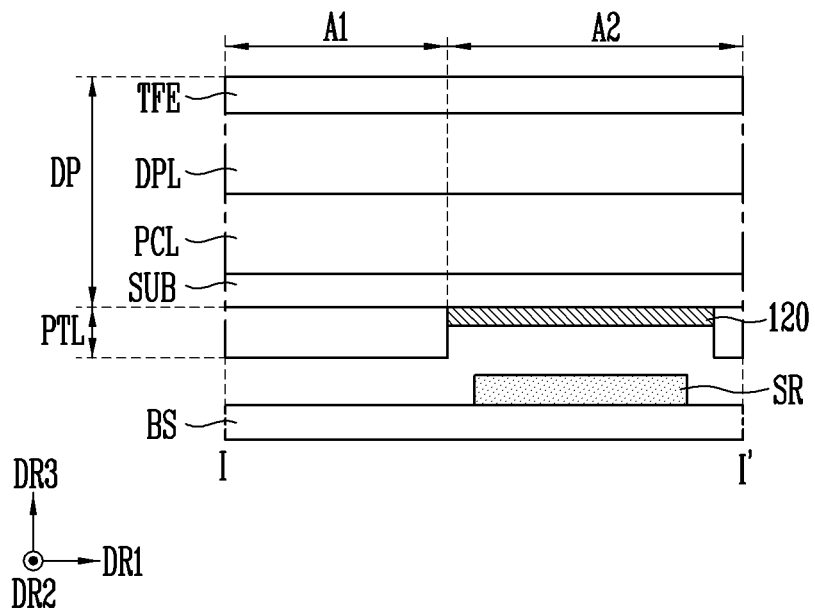
FIGS. 9 to 12 are schematic cross-sectional views taken along a line I-I' of FIG. 1 for illustrating exemplary embodiments of the reflection reduction member of FIG. 5.

Referring to FIG. 9, external light applied through the second display area A2 may be provided to a first anti-reflection film 120.

The sensor SR may be arranged in the second display area A2 when viewed from above. The sensor SR may receive a large amount of light by receiving the external light through the second display area A2 having a relatively large area. Accordingly, accuracy of information on sensed light may be improved. However, as the second display area A2 increases, the amount of reflection light may increase due to an increase of the amount of the external light.

The size of the second display area A2 may correspond to the size of the first anti-reflection film 120. The size of the second display area A2 may be greater than the size of an upper surface of the sensor SR. The size of the first anti-reflection film 120 may be greater than the size of the upper surface of the sensor SR. The first anti-reflection film 120 covers the area greater than that of the sensor SR, and thus the amount of the reflection light for the external light that may be applied to the pixel circuit portion PCL and/or the display element portion DPL may be reduced.

A predetermined air gap may be formed between the sensor SR and the first anti-reflection film 120.

At least a portion of the first anti-reflection film 120 and the sensor SR may be spaced apart from each other. In this case, a manufacturing process related to the sensor SR and a manufacturing process related to the first anti-reflection film 120 may be separately performed, thereby increasing convenience in a process design.

Figure 10:
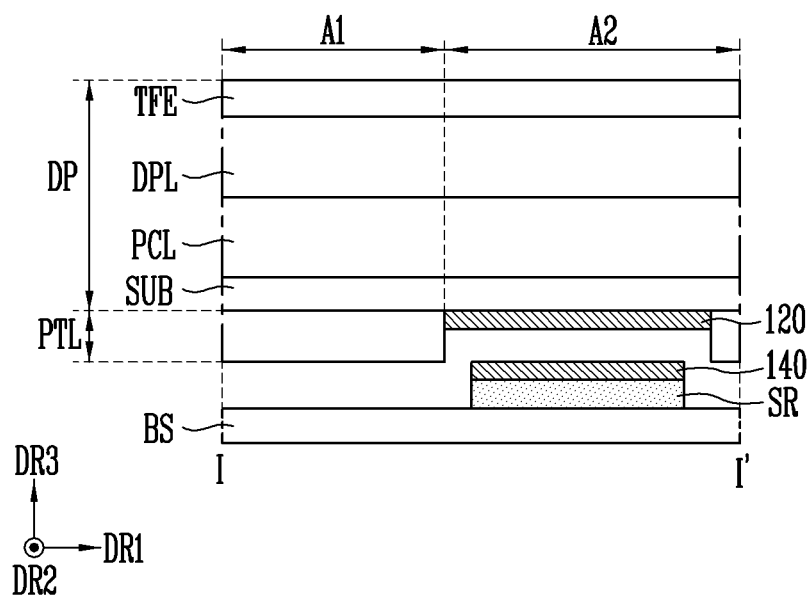

Referring to FIG. 10, the display device 1 may further include a second anti-reflection film 140.

The second anti-reflection film 140 may be an AR coating similarly to the first anti-reflection film 120.

The second anti-reflection film 140 may face the first anti-reflection film 120. The second anti-reflection film 140 may be positioned on a surface of the sensor SR facing the first anti-reflection film 120. For example, the second anti-reflection film 140 may be provided on one surface of the substrate SUB where the cover panel PTL is not positioned. The second anti-reflection film 140 may cover substantially all of the upper surface of the sensor SR.

The second anti-reflection film 140 is coated on the sensor SR, and thus the amount of reflection light for external light that may be generated on the upper surface of the sensor SR may be reduced. As such, the first and second anti-reflection films 120 and 140 may reduce deterioration of the elements of the display device 1 such as the pixel circuit portion PCL and the display element portion DPL.

The size of the first anti-reflection film 120 may be greater than that of the second anti-reflection film 140. Therefore, even though a small amount of light reflection that may occur in the second anti-reflection film 140 is generated, the generated reflection light may be prevented from being applied to the pixel circuit portion PCL or the display element portion DPL. In an exemplary embodiment, the size of the first anti-reflection film 120 may be less than that of the second anti-reflection film 140.

Figure 11:
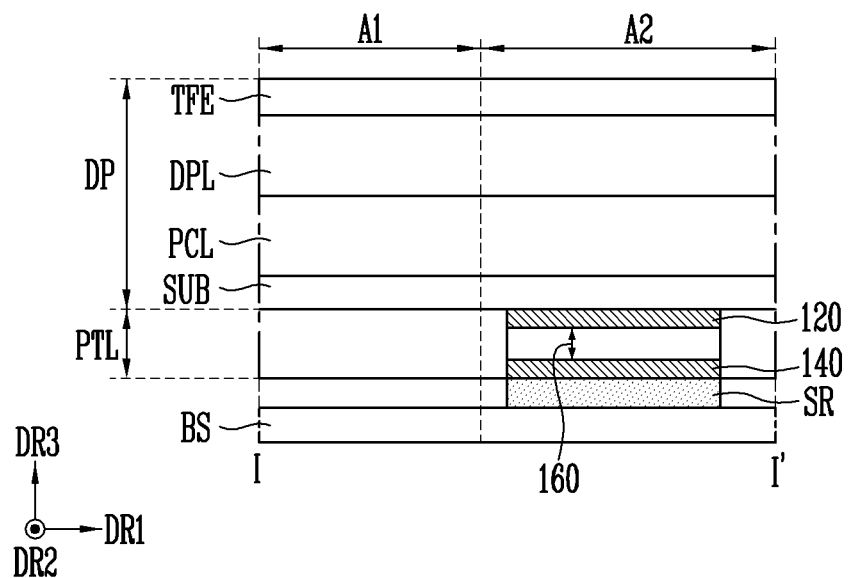

Referring to FIG. 11, the size of the first anti-reflection film 120 may correspond to the size of the second anti-reflection film 140. When viewed from above, the size of the first anti-reflection film 120 may be substantially the same as the size of the second anti-reflection film 140.

An air gap 160 may be formed between the first anti-reflection film 120 and the second anti-reflection film 140.

The second anti-reflection film 140 may be adjacent to the cover panel PTL in the first direction DR1. In this case, similarly to the case where the size of the first anti-reflection film 120 is greater than that of the second anti-reflection film 140, the influence on individual configurations in the display device 1, which may be generated due to the reflection light for the external light that may be generated in the second anti-reflection film 140 may be reduced.

That is, when reflection light is generated on a surface of the second anti-reflection film 140, the generated reflection light may be directed to the first anti-reflection film 120 or to the cover panel PTL, and finally the influence on the pixel circuit portion PCL or the display element portion DPL may be attenuated.

The display device 1 including the first anti-reflection film 120 and the second anti-reflection film 140 according to FIG. 11 may have an improved and/or relatively low reflectance when compared with a conventional display device. The display device 1 including the first anti-reflection film 120 and the second anti-reflection film 140, in which the area of the first anti-reflection film 120 corresponds to the area of the second anti-reflection film 140 may have a reflectance of about 3.5% to about 4.5% when a predetermined amount of external light is applied, and preferably, may have a reflectance of about 3.99%. The experiment on the reflectance was conducted using a standard illuminant (e.g., standard illuminant D65) and a spectroscope in a darkroom. However, this experiment may be performed using an illuminant A or C, and a different type of integrating sphere other than the spectroscope.

In contrast, a display device in which an anti-reflection film is not provided may have a reflectance of about 7.46% when the above amount of external light is applied. As such, the display device 1 may have an improved reflectance by having the first anti-reflection film 120 and the second anti-reflection film 140.

Figure 12:
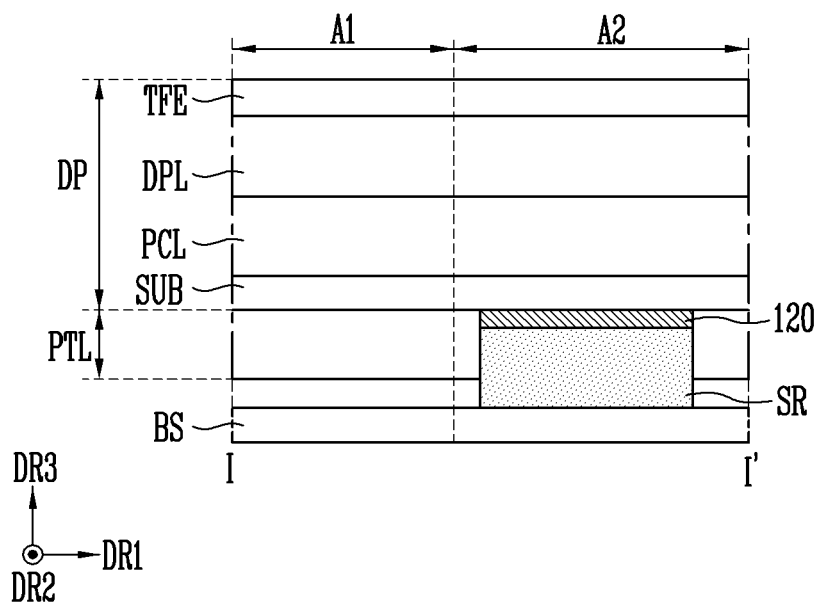

Referring to FIG. 12, the first anti-reflection film 120 may be coated on the rear surface of the substrate SUB, and may be coated on the upper surface of the sensor SR. A first surface of the first anti-reflection film 120 may be in contact with the substrate SUB, and a second surface of the first anti-reflection film 120 may be in contact with the sensor SR. The second surface may be opposite to the first surface. In this case, an air gap may not be formed between the sensor SR and the substrate SUB.

When the first anti-reflection film 120 is included between the substrate SUB and the sensor SR without the air gap therebetween, the amount of reflection light for the applied light may be reduced.

Figure 13:
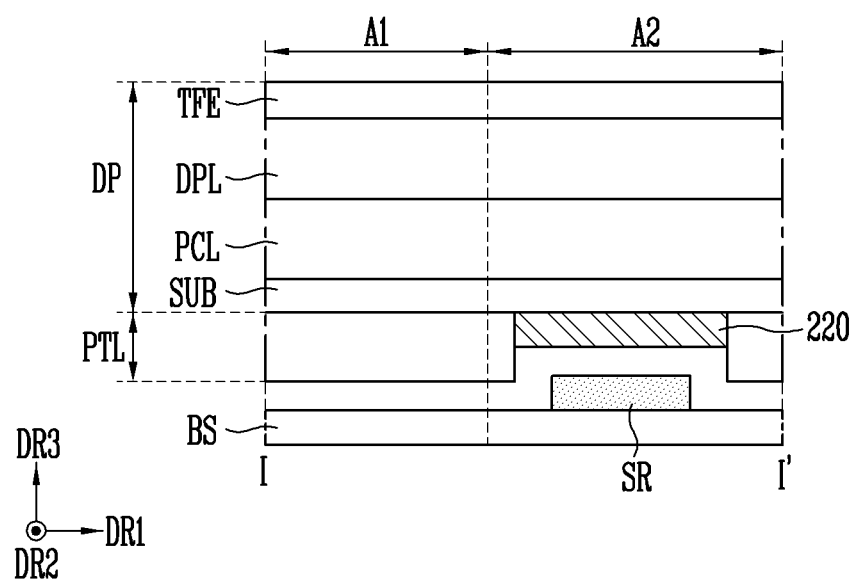
FIGS. 13 to 15 are schematic cross-sectional views taken along a line I-I' of FIG. 1 to illustrate other exemplary embodiments of the reflection reduction member of FIG. 5.
Figure 14:
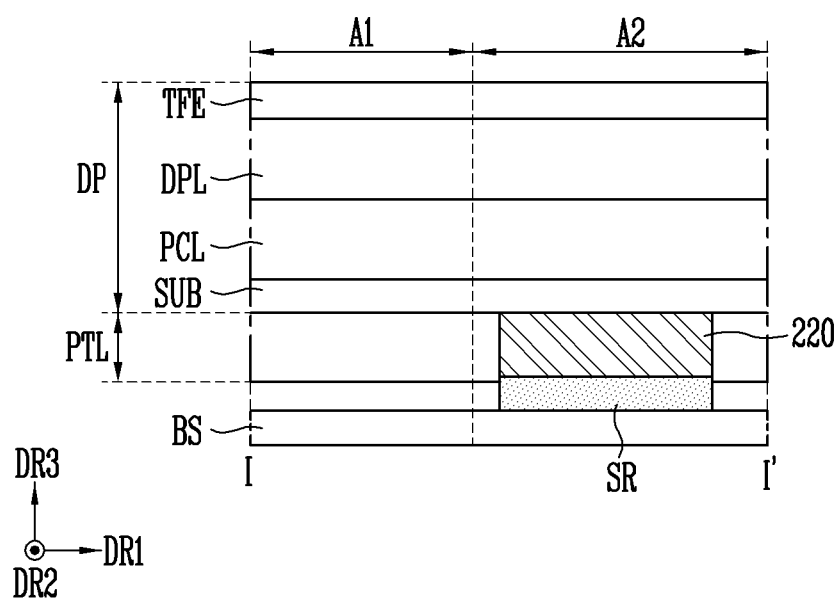
Figure 15:
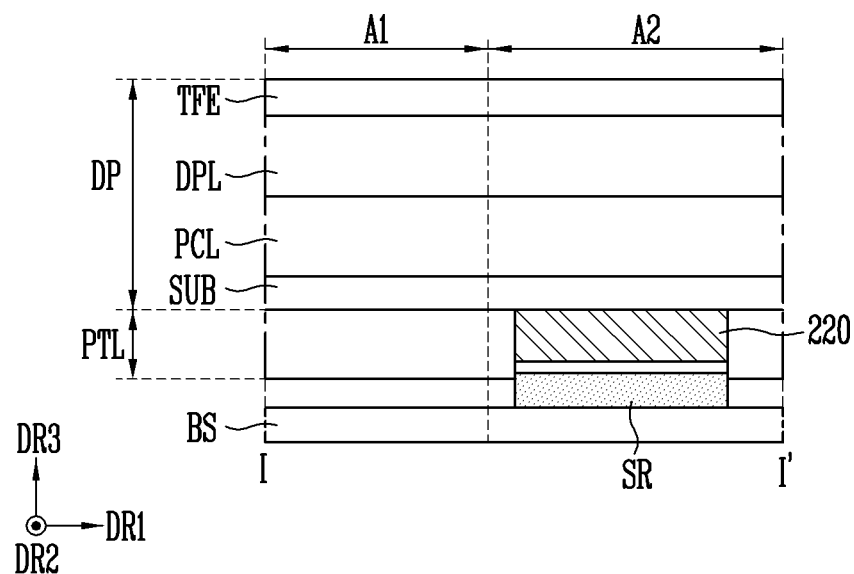

FIGS. 13 to 15 are schematic cross-sectional views taken along a line I-I' of FIG. 1 to illustrate other exemplary embodiments of the reflection reduction member of FIG. 5.

Referring to FIGS. 13 to 15, the reflection reduction member 100 of FIG. 5 may include a filler 220.

The filler 220 may include a colorless material having a transmittance of a predetermined value or more. According to an example, the filler 220 may include resin of epoxy, urethane acrylate, epoxy acrylate or silicones (for example, bisphenol A type epoxy, cycloaliphatic epoxy resin, phenyl silicone resin, rubber, acrylic epoxy resin, aliphatic urethane acrylate, or the like). Alternatively, the filler 220 may include a material selected from a group consisting of hexamethyldisiloxane, octamethyltrisiloxane, decamethyltetrasiloxane, dodecamethylpentasiloxane, and polydimethylsiloxanes.

However, the type of the filler 220 is not limited to the above-described example, and various known fillers may be applied.

Referring to FIG. 13, the filler 220 may be positioned on the rear surface of the substrate SUB. For example, the filler 220 may be positioned on the rear surface of the substrate SUB where the cover panel PTL is not positioned.

The filler 220 may be spaced apart from the sensor SR. Therefore, a predetermined air gap may be formed between the filler 220 and the sensor SR.

When viewed from above, the sensor SR may be positioned on one surface of the base portion BS to correspond to and/or overlap the filler 220. The filler 220 may have an area (size) greater than that of the sensor SR when viewed in the third direction DR3. The filler 220 may reduce deterioration of pixel circuit portion PCL and the display element portion DPL caused by the influence of the light reflected by, for example, a portion of the display device 1 disposed below the filler 220.

The refractive index of the filler 220 may be different from that of the substrate SUB.

The refractive index of the filler 220 may be substantially equal to or greater than about 1.3 and substantially equal to or less than about 1.7. The refractive index of the substrate SUB may be substantially equal to or greater than about 1.4 and substantially equal to or less than about 1.6.

The difference between the refractive index of the filler 220 and the refractive index of the substrate SUB is substantially equal to or less than a predetermined difference, and thus the amount of reflection of the external light applied to the second display area A2 may be reduced. For example, if the filler 220 is not provided, the difference between the refractive index of air positioned between the sensor SR and the substrate SUB and the refractive index of the substrate SUB may be substantially equal to or greater than about 0.4 and substantially equal to or less than about 0.6. In this case, a large amount of light may be reflected by a surface between the air and the substrate SUB due to the relatively high refractive index difference.

Referring to FIG. 14, an air gap may not be formed between the filler 220 and the sensor SR.

The refractive index of air may be about 1, and individual configurations may have a refractive index greater than at least about 1. In the case where an air gap is not formed between the filler 220 and the sensor SR, the difference in the refractive indices between layers corresponding to the second display area A2 may be reduced, and thus the degree of reflection of the applied external light may be reduced.

Specifically, the refractive index of the sensor SR that is in contact with the filler 220 may be at least greater than that of air. Since the difference in refractive index between the filler 220 and the sensor SR is at least less than the difference in refractive index between the filler 220 and the air, in the case where an air gap is not formed between the filler 220 and the sensor SR, the amount of reflection of the external light may be reduced.

The display device including the filler 220 according to the illustrated embodiment of FIG. 14 may have improved and/or relatively low reflectance when compared with a conventional display device. For example, as described above, a display device in which the reflection reduction member 100 is not included may have a reflectance of about 7.46% when a certain amount of external light is applied to the sensor SR. However, as shown in FIG. 14, the display device 1 including the filler 220, in which an air gap is not formed between the filler 220 and the sensor SR, may have a reflectance of about 0.02% when a certain amount of external light is applied to the sensor SR. This may mean that the display device 1 including the filler 220 of FIG. 14 has the improved reflectance compared to the conventional display device.

Referring to FIG. 15, the size of the filler 220 may correspond to the size of the sensor SR. When viewed from above, the size of the filler 220 may be substantially the same as the size of the sensor SR. A predetermined air gap may be formed between the filler 220 and the sensor SR, as shown in FIG. 15.

The display device including the filler 220 of FIG. 15 may have an improved and/or relatively low reflectance when compared with a conventional display device. The display device 1 including the filler 220, in which an air gap is formed between the filler 220 and the sensor SR, may have a reflectance substantially equal to or less than about 7% when a certain amount of external light is applied to the sensor SR. Such reflectance is a value less than about 7.46% that is reflectance data obtained in an experiment conducted on a display device in which the filler 220 is not included. The display device 1 may have the improved reflectance for the external light.

The cover panel PTL may be arranged on the rear surface of the substrate SUB where the filler 220 is not positioned. The cover panel PTL may be positioned on one area of the rear surface of the substrate SUB, and the filler 220 may be positioned on another area of the substrate SUB.

Therefore, the influence on the pixel circuit portion PCL and/or the display element portion DPL due to the reflection light generated on the upper surface of the sensor SR may be reduced or prevented by the cover panel PTL or the filler 220.

Figure 16:
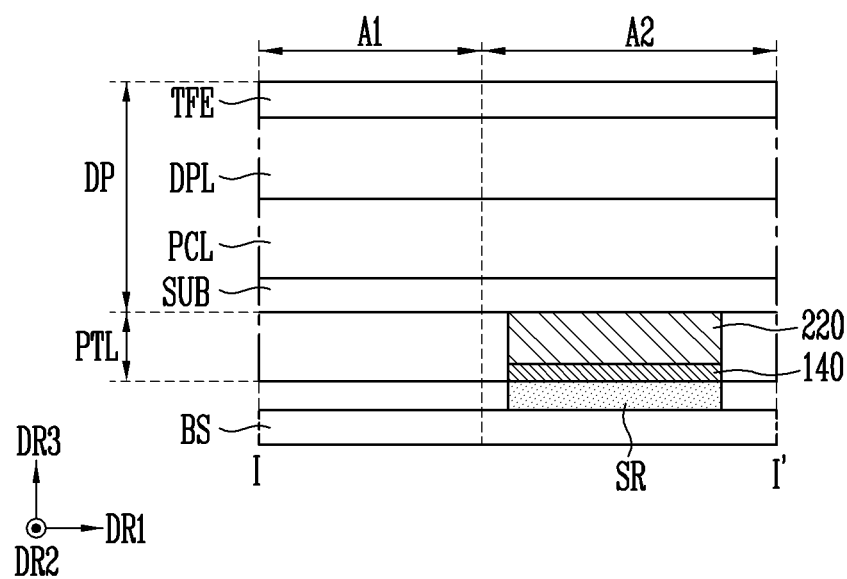
FIGS. 16 to 18 are schematic cross-sectional views taken along a line I-I' of FIG. 1 for illustrating still other exemplary embodiments of the structure of the reflection reduction member of FIG. 5.
Figure 17:
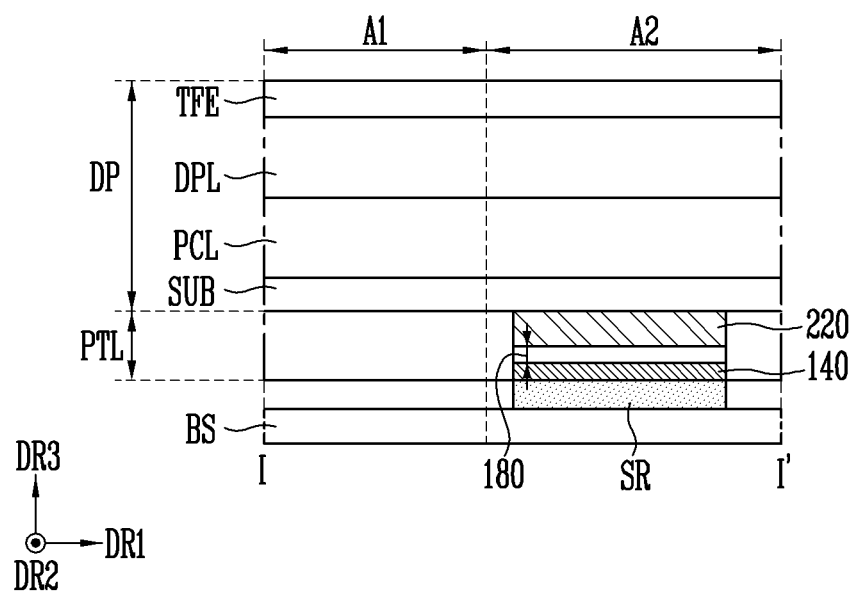
Figure 18:
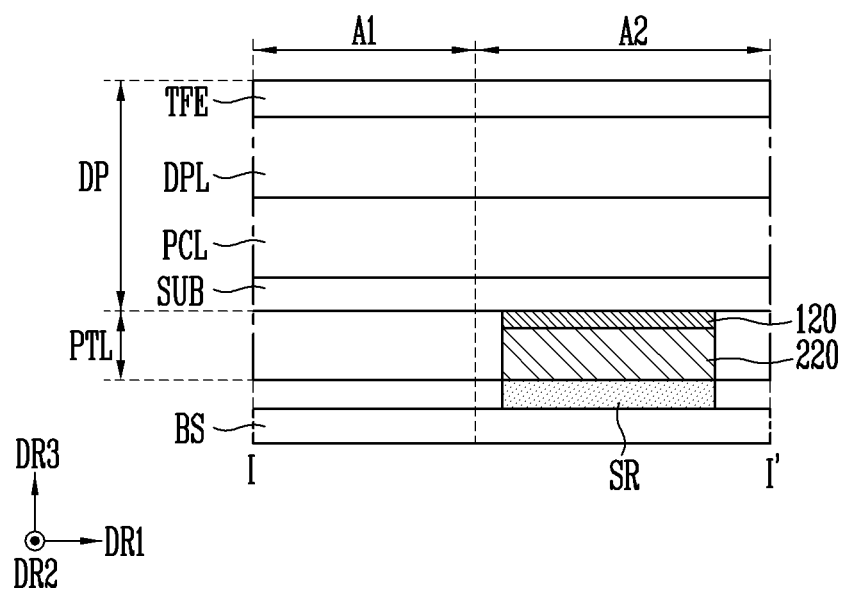

FIGS. 16 to 18 are schematic cross-sectional views taken along a line I-I' of FIG. 1 to illustrate still other exemplary embodiments of the structure of the reflection reduction member of FIG. 5.

Referring to FIGS. 16 to 18, the reflection reduction member 100 of FIG. 5 may include at least one of the first anti-reflection film 120 or the second anti-reflection film 140, and may further include the filler 220.

The reflection reduction member 100 applied to the display device 1 may include the first reflection reduction member and the second reflection reduction member.

The first reflection reduction member may be the filler 220. The filler 220 may be a colorless material having a transmittance of a predetermined value or more, as described above with reference to FIGS. 13 to 15.

The second reflection reduction member may be at least one of the first anti-reflection film 120 or the second anti-reflection film 140. The second reflection reduction member may be an AR coating.

Referring to FIG. 16, the filler 220 may be disposed on the rear surface of the substrate SUB where the cover panel PTL is not positioned.

The second anti-reflection film 140 may be positioned on the upper surface of the sensor SR. The second anti-reflection film 140 may be coated on the surface of the sensor SR facing the substrate SUB.

The area of the filler 220 may overlap the area of the sensor SR. The area of the filler 220 may be substantially equal or at least greater than that of the sensor SR when viewed from above.

The area of the second anti-reflection film 140 may overlap the area of the sensor SR. The area of the second anti-reflection film 140 may be substantially equal to or at least greater than that of the sensor SR when viewed from above.

When viewed from above, the second anti-reflection film 140 and the filler 220 may be positioned in the second display area A2. As described above, the external light may be applied through the second display area A2, and the second anti-reflection film 140 and the filler 220 may be continuously arranged, thereby further reducing the reflection of the external light.

Referring to FIG. 17, a predetermined air gap 180 may be formed between the filler 220 and the second anti-reflection film 140. The area of the filler 220 and the area of the second anti-reflection film 140 may overlap each other. The area of the filler 220 may be substantially the same as that of the second anti-reflection film 140, the second anti-reflection film 140 and the filler 220 may be at least physically spaced apart, and the predetermined air gap 180 may be provided.

Referring to FIG. 18, the display device 1 may include the first anti-reflection film 120 and the filler 220 without the second anti-reflection film 140.

The first anti-reflection film 120 may be positioned between the substrate SUB and the filler 220. According to an example, the first anti-reflection film 120 may be coated on the rear surface of the substrate SUB where the cover panel PTL is not disposed.

The filler 220 may be positioned between the substrate SUB and the sensor SR, and may be positioned between the first anti-reflection film 120 and the sensor SR.

The filler 220 may be at least spaced apart from the first anti-reflection film 120. In this case, an air gap may be formed between the filler 220 and the first anti-reflection film 120.

Each of the area of the filler 220 and the area of the first anti-reflection film 120 may have a value substantially equal to or at least greater than that of the upper surface of the sensor SR, and thus the amount of the reflection of the external light applied through the second display area A2 may be reduced.

In an exemplary embodiment, the display device 1 may include all of the first anti-reflection film 120, the second anti-reflection film 140, and the filler 220. According to an exemplary embodiment, the first anti-reflection film 120 may be positioned on the rear surface of the substrate SUB, the second anti-reflection film 140 may be positioned on the sensor SR, the filler 220 may be interposed between the first anti-reflection film 120 and the second anti-reflection film 140.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel including a substrate having first and second opposing surfaces and a light emitting element disposed on the first surface of the substrate, the display panel having a transmission area through which light is transmitted from outside the display device;
    a sensor facing the surface of the substrate and configured to sense light received through the transmission area; and
    an anti-reflective member disposed between the sensor and the substrate and to transmit light such that reflection of applied light is reduced, the anti-reflective member comprising a reflection reduction member including a first anti-reflection film and a second anti-reflection film,
    wherein each of the first and second anti-reflection films comprises an anti-reflective coating,
    wherein the anti-reflective member overlaps the transmission area when viewed in a direction normal to the first and second surfaces of the substrate, and
    wherein the first anti-reflection film is directly disposed on a surface of the sensor facing the substrate and the second anti-reflection film is directly disposed on the second surface of the substrate facing the sensor.

2. The display device of claim 1, wherein the sensor overlaps the anti-reflective member.

3. The display device of claim 1, further comprising:
    a base facing the substrate,
    wherein the sensor is disposed on the base.

4. The display device of claim 1, further comprising:
    a cover panel disposed on the second surface of the substrate without overlapping the transmission area and without overlapping the sensor.

5. The display device of claim 1, wherein the anti-reflective member has a refractive index different from a refractive index of the substrate.

6. The display device of claim 5, wherein the refractive index of the anti-reflective member is substantially equal to or greater than about 1.3 and is equal to or less than about 1.7.

7. The display device of claim 1, wherein the reflection reduction member includes a filler having a transmittance of a predetermined value or more.

8. The display device of claim 7, wherein the reflection reduction member is physically spaced apart from the sensor so that an air gap is formed between the reflection reduction member and the sensor.

9. The display device of claim 7, wherein the reflection reduction member is in physical contact with the sensor so that no air gap is formed between the reflection reduction member and the sensor.

10. The display device of claim 7, wherein the sensor overlaps the reflection reduction member.

11. The display device of claim 1, wherein the first anti-reflection film overlaps the second anti-reflection film.

12. The display device of claim 1, wherein the first anti-reflection film includes a third surface and a fourth surface opposing the third surface,
    the third surface is in contact with the substrate, and
    the fourth surface is in contact with the sensor.

13. The display device of claim 11, wherein the second anti-reflection film is disposed in a region where the first anti-reflection film is positioned.

14. The display device of claim 1, further comprising:
    an air gap formed between the first anti-reflection film and the second anti-reflection film.

15. The display device of claim 1, wherein the sensor includes at least one of an optical fingerprint sensor, an illumination sensor, a proximity sensor, a camera module, and a light sensor.

16. A display device comprising:
    a display panel including a substrate having first and second opposing surfaces and a light emitting element disposed on the first surface of the substrate, the display panel having a transmission area through which light is transmitted from outside the display device;

a sensor facing the surface of the substrate and configured to sense light received through the transmission area; and an anti-reflective member disposed between the sensor and the substrate and to transmit light such that reflection of applied light is reduced, the anti-reflective member comprising a reflection reduction member including a first anti-reflection film and a second anti-reflection film, wherein each of the first and second anti-reflection films comprises an anti-reflective coating, wherein the anti-reflective member overlaps the transmission area when viewed in a direction normal to the first and second surfaces of the substrate, wherein the anti-reflective member comprises a first reflection reduction member and a second reflection reduction member, the first reflection reduction member comprises a filler having a transmittance of a predetermined value or more, the second reflection reduction member comprises an anti-reflective coating, and an air gap formed between the first reflection reduction member and the second reflection reduction member.

17. The display device of claim 16, wherein the second reflection reduction member is coated on the sensor.

* * * * *